(12) United States Patent
Gray et al.

(10) Patent No.: US 6,988,061 B2
(45) Date of Patent: Jan. 17, 2006

(54) OPERATIONAL VERIFICATION FOR PRODUCT SAFETY TESTERS

(75) Inventors: Jeffrey Ross Gray, San Diego, CA (US); Jeffrey Douglas Lind, San Diego, CA (US)

(73) Assignee: Compliance West USA, San Diego, CA (US)

( * ) Notice: Subject to any disclaimer, the term of this patent is extended or adjusted under 35 U.S.C. 154(b) by 840 days.

(21) Appl. No.: 09/883,862

(22) Filed: Jun. 18, 2001

(65) Prior Publication Data

US 2002/0038205 A1    Mar. 28, 2002

Related U.S. Application Data

(60) Provisional application No. 60/211,920, filed on Jun. 16, 2000.

(51) Int. Cl.
*G06F 13/10* (2006.01)
*G01R 31/00* (2006.01)
*G01R 31/14* (2006.01)
*G01R 31/08* (2006.01)
*G01R 31/06* (2006.01)

(52) U.S. Cl. .................. 703/20; 324/500; 324/509; 324/522; 324/548

(58) Field of Classification Search ............... 324/500, 324/509, 522, 548; 703/20
See application file for complete search history.

(56) References Cited

U.S. PATENT DOCUMENTS

| 3,287,635 | A | * | 11/1966 | Mole ........................ 324/551 |
|---|---|---|---|---|
| 4,293,923 | A | * | 10/1981 | Jasmin et al. ................ 703/4 |
| 4,490,799 | A | * | 12/1984 | Marino et al. .............. 701/102 |
| 6,005,404 | A | * | 12/1999 | Cochran et al. ............ 324/760 |
| 6,011,398 | A | * | 1/2000 | Bald et al. ................. 324/511 |
| 6,054,865 | A | * | 4/2000 | Bald et al. ................. 324/551 |
| 6,373,270 | B1 | * | 4/2002 | Cochran et al. ............ 324/760 |
| 6,745,146 | B1 | * | 6/2004 | Brown et al. .............. 702/123 |

OTHER PUBLICATIONS

European Standard Appendix A, European Committee for Electrotechnical Standardization, "Information technology equipment; Routine electrical safety testing in production," EN 50116:1996, pp. 1-6, Aug. 1996.

European Standard Appendix B, European Committee for Electrotechnical Standardization "Safety of household and similar electrical appliances Particular Rules for routine tests referring to appliances under the scope of EN 60335-1 and EN 60967," EN50108:1997, Feb. 1997.

European Standard Appendix E, European Committee for Electrotechnical Standardization "Rules for routine tests," EN50155-1:1995, pp. 107-109, 1995.

* cited by examiner

*Primary Examiner*—Paul L. Rodriguez
*Assistant Examiner*—Dwin M. Craig
(74) *Attorney, Agent, or Firm*—Knobbe Martens Olson & Bear LLP

(57) ABSTRACT

An apparatus for verifying the functionality of a production line electronics safety tester such as the hipot tester/ground continuity tester. The apparatus simulates a product to be tested by a safety tester and can be configured to simulate a passing or failing product for each of a plurality of separate tests.

15 Claims, 3 Drawing Sheets

OPERATIONAL VERIFICATION FOR PRODUCT SAFETY TESTERS

CROSS REFERENCE TO RELATED APPLICATION

This application claims priority to Provisional Application No. 60/211920, entitled "OPERATIONAL VERIFICATION OF HIPOT/GROUND CONTINUITY TESTERS" filed Jun. 16, 2000, and incorporated herein by reference in its entirety.

BACKGROUND OF THE INVENTION

1. Field of the Invention

The present invention relates to electrical/electronic test equipment, and more particularly to operational test equipment for electrical/electronic test equipment.

2. Description of the Related Art

During or after the manufacture of many electrical and electronic products a series of safety tests are performed to ensure proper operation of the products under specific conditions. These test conditions are described in many industry standards, including IEC 60-950, 61010-1, 60335-1, 60601, EN50116, EN50106, and EN50114-1, the disclosures of which are hereby incorporated by reference in their entirety. Two safety tests that are performed on electronic products are a dielectric withstand ("hipot") test and a ground continuity test. These tests are referred to in the European Standard documents listed above as the Electric Strength test and the Earth or Earthing Continuity test.

The electric strength test recited in EN50116 includes applying to the electronic equipment under test a sinusoidal AC voltage at 50 or 60 Hz of at least 1500 Volts for a product having basic insulation where the passing requirements are that no insulation breakdown shall occur during the test. EN50116 defines an insulation breakdown as any significant increase from the steady state current measured during the electric strength test. The EN50106 and EN50144-1 documents both list a test voltage of 1000 Volts for a product having basic insulation with a similar breakdown requirement.

The earth continuity test of EN50144-1 comprises passing a current of at least 10 Amps between the earthing/grounding terminal or earthing/grounding contact of the electronic product under test and accessible metal parts which need to be grounded for safety reasons. The voltage drop between the ground terminal or contact and the accessible metal part is measured, and the resistance is calculated from this voltage drop and the level of current supply. EN50144-1 sets this resistance at a maximum of 0.3Ω while EN50106 cites a limit of 0.2Ω for appliances having a supply chord, and EN50116 lists a limit of 0.1Ω. An additional safety test typically performed on electronic products is that of exceptional levels of leakage current from the primary circuits to the ground terminal, 1.5 mA for example, in the product under test.

Several vendors supply testers that perform one or more of these tests, and their operation is well known in the art. Due to their importance in the verification that manufactured products are safe for consumer use, it is critical that the testers function properly and do not indicate a passing result when the product under test is actually in a failing condition.

It will be appreciated that a device for verifying the integrity of an electronics tester would be valuable to both the manufacturers and users of the electronics testers.

SUMMARY OF THE INVENTION

The present invention is a product simulator for verifying the functionality of an electrical product safety tester. In one embodiment, the product simulator comprises a housing, an arc view window, and at least one switch, wherein an operator can view the break down of an air gap device through the arc view window, and wherein the switch is configured to alter a test path in the product simulator so as to alternatively simulate a product that passes a production line dielectric test and a product that fails a production line dielectric test.

In another embodiment, the simulator comprises a plurality of electrical input/output terminals for connection to a plurality of test terminals on the tester, a first test path comprising a high voltage input from a first terminal, a first switch, an spark plug device designed to arc over at a specific high level voltage, and a second terminal. The simulator can also include a second test path comprising the high voltage input, a second switch, and the second terminal, and a third test path comprising a third terminal, a third switch, and the second terminal.

The invention also includes a method of verifying the operation of hipot testers, comprising connecting a plurality of test terminals of the hipot/ground continuity tester to a plurality of test terminals of a simulator, wherein the test terminals comprise a hipot terminal, a return terminal, and a chassis terminal, and setting a plurality of switches on the simulator to a 'PASS' position, wherein the switches include a hipot switch, a leakage switch, and a ground switch. The method includes conducting a 'PASSING' test by starting the tester, wherein the 'PASSING' test comprises supplying a high voltage input between the hipot terminal and the return terminal of the simulator, wherein the 'PASS' position for the hipot switch is open, thereby producing an open circuit condition between the hipot terminal and the return terminal, and verifying a 'PASS' condition on the tester for the 'PASSING' test. The method also includes conducting a hipot failure test by setting the hipot switch on the simulator to a 'FAIL' position and initiating the hipot test by starting the tester, wherein the 'FAIL' position for the hipot switch is closed, thereby allowing the high voltage input across an air-gap device designed to break down at approximately the level of the high voltage input. A 'FAIL' condition on the tester can then be verified for the hipot failure test.

The verification method can also include conducting an excess leakage test by setting the leakage switch on the simulator to a 'FAIL' position and initiating the excess leakage test by starting the tester, wherein the 'FAIL' position for the leakage switch is closed, thereby producing a short circuit condition across the hipot terminal and the return terminal. A 'FAIL' condition on the tester can then be verified for the excess leakage test.

In addition, a ground open test can be performed by setting the ground switch on the simulator to a 'FAIL' position and initiating the ground open test by starting the hipot tester, wherein the 'FAIL' position for the ground switch is open, thereby producting an open circuit condition to the chassis terminal and the return terminal, and a 'FAIL' condition can be verified on the tester for the ground open test.

DETAILED DESCRIPTION OF THE PREFERRED EMBODIMENT

Embodiments of the invention will now be described with reference to the accompanying Figures, wherein like numerals refer to like elements throughout. The terminology used in the description presented herein is not intended to be interpreted in any limited or restrictive manner, simply because it is being utilized in conjunction with a detailed description of certain specific embodiments of the invention. Furthermore, embodiments of the invention may include several novel features, no single one of which is solely responsible for its desirable attributes or which is essential to practicing the inventions herein described.

Figure 1:
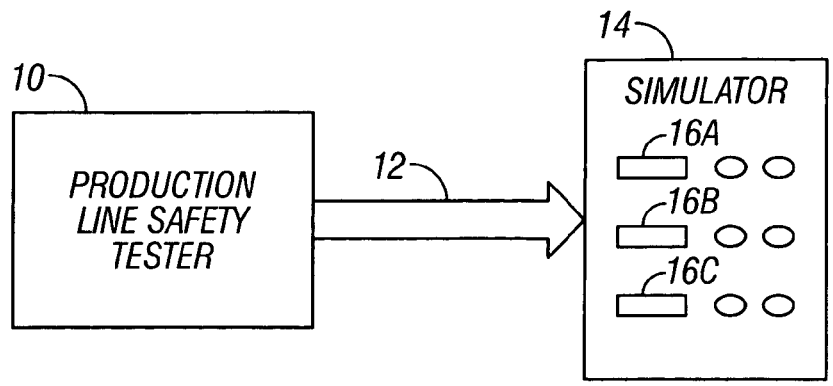
FIG. 1 is a block diagram illustrating a production line safety tester connected to a simulator apparatus.
Figure 2:
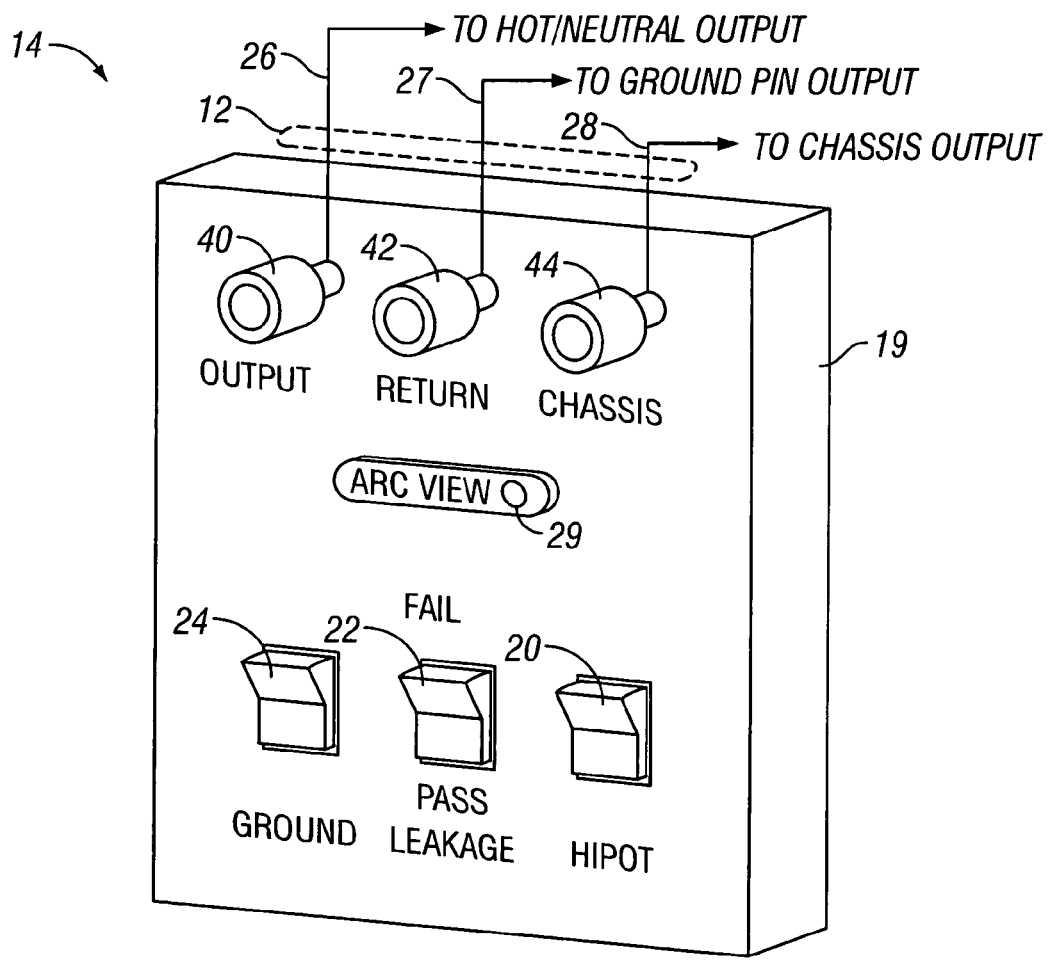
FIG. 2 is an illustration of one embodiment of a simulator.

In one embodiment the present invention comprises an apparatus for verifying the functionality of a production line electronics safety tester such as the hipot tester/ground continuity tester. The apparatus simulates a product to be tested by a safety tester and can be configured to simulate a passing or failing product for each of a plurality of separate tests. The simulator can be portable and can be optionally configured to calibrate the tester to operate according to the required safety standards for the tests performed by the tester. The simulator can include a plurality of switches for independently controlling each condition under each safety test. Referring to FIG. 1, a block diagram illustrates a production line safety tester 10 coupled using a plurality of coupling leads 12 to a simulator 14. The coupling leads 12 can be comprised of a plurality of electrical leads that may be customized for the particular safety tester 10 under test. The simulator 14 comprises three switches 16A–C which can simulate passing and failing equipment for a dielectric withstand test between primary and ground circuits, a ground continuity test, and a high leakage current test between primary circuits and ground, respectively. Any number of switches 16A–C may be included in the simulator 14 so as to simulate any number of tests to be performed by the tester 10. FIG. 2 is an illustration of one embodiment of a simulator 14. The simulator 14 of FIG. 2 comprises a housing 19, a hipot switch 20, a leakage switch 22, and a ground switch 24 than can be switched to simulate either a 'PASS' or 'FAIL' condition for the hipot test, the excess leakage current test, and the ground continuity test, respectively, performed by the tester 10. Also shown are three electrical connection terminals for connection to the hot/neutral output 26, the ground pin output 27, and the chassis output 28 of the tester 10 using coupling leads 12. An arc view window 29, discussed further hereafter, may also be included on the simulator housing 19.

Figure 3:
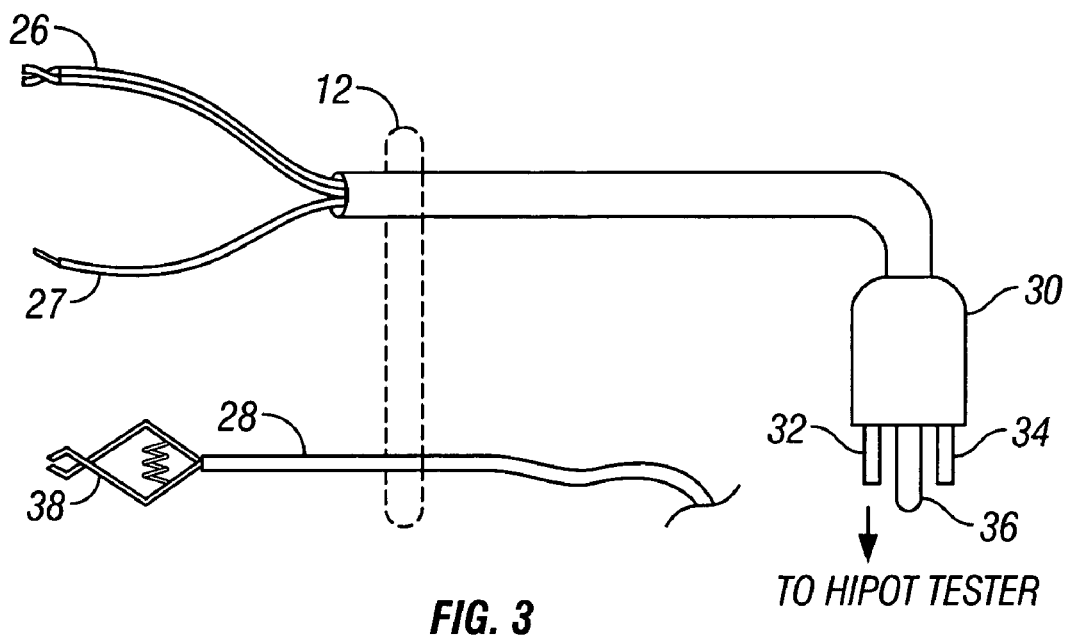
FIG. 3 is an illustration of coupling leads that can be used to couple a simulator to a production line safety tester.

FIG. 3 illustrates exemplary electrical leads 12 that can be used to connect the simulator 14 to the tester 10 for many types of commercially available production line safety testers. The leads shown in FIG. 3 include an ordinary three prong AC plug 30 having two AC pins 32, 34 and a ground pin 36. The AC pins 32, 34 connections are wired together to form a single lead 26 for connection to an output terminal on the simulator 14 while the ground pin has a single lead 27 for connection to the ground terminal on the simulator 14. An additional chassis output lead 28 is included in the coupling leads 12 of many testers with a connection means such as an alligator clip 38, which is connected to the chassis terminal on the simulator 14.

Figure 4:
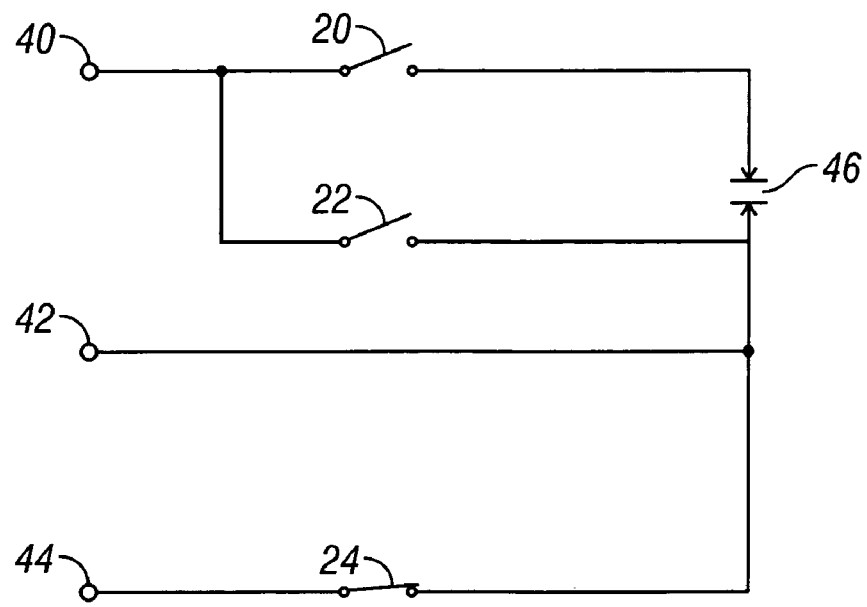
FIG. 4 is an exemplary schematic diagram of one implementation of the simulator of FIG. 2.

FIG. 4 is an exemplary schematic diagram of one implementation of the simulator 14 of FIG. 2. The three switches 20, 22, and 24 are shown which correspond in operation to the switches 20, 22, 24 shown in FIG. 2. All switches 20–24 in FIG. 4 are shown in the 'PASS' position.

A high voltage terminal 40 is provided on the simulator 14 for connection to the dielectric withstand high voltage output 26 of the tester 10, and a return terminal 42 is provided for connection to the dielectric withstand high voltage return lead 27 of the tester 10. A chassis terminal 44 is provided in the simulator 14 for connection to the tester 10 chassis connection terminal 28.

The test path for the dielectric withstand high voltage test comprises the high voltage terminal 40, the hipot switch 20, a spark plug 46 or other air gap device that is designed to arc over or break down at a specific voltage, and the return terminal 42. A commercially available two or four stroke engine spark plug 46 can be configured to break down at a voltage level slightly below the level at which the tester performs the high voltage test, for example 750 Volts for a 1000 Volt test value. Commercially available spark plugs are designed to arc over an extensive number of times and therefore their reliability meets the desired test environment for the simulator. The Autolite 3136 is one example of a commercially available spark plug wherein the gap can be adjusted and the spark plug implemented as the spark plug 46 in the simulator 14.

When the hipot switch 20 is open and the tester 10 is in testing mode, no breakdown will occur and the hipot tester 10 should indicate a passing result. When the hipot switch 20 is closed and the voltage supplied between terminals 40 and 42 reaches the voltage at which the spark plug 46 arcs (750 V, example), a spark will be visible across the spark plug 46 through the arc view window 29 and a failure should be identified by the dielectric break down failure indicater on the tester 10.

The arc view 29 window may be included on the simulator 14, as shown in FIG. 2, and placed near the gap of the spark plug so as to view the arcing of the spark plug 46 or break down of any other air gap device when the hipot switch 20 is in the 'FAIL' position. The view window 29 can be made of a magnifying type of material such as a plastic fresnal lens so as to magnify the spark and make it more visible to the operator. An example lens to be used in the arc window 29 is the SMC-170 CTP from Visual Communications Company of San Diego, Calif. The view window 29 allows the operator to ensure the simulator is working correctly under the high voltage failure test conditions. It will be appreciated that the use of a reliable and long lasting arc device 46, along with a visual monitor 29 of the arc itself, would be beneficial to the operation of the simulator 14 and the verification of its integrity.

The excess leakage test path comprises the high voltage terminal 40, the leakage switch 22, and the return terminal 42. As the high voltage is supplied across the high voltage terminal 40 and the return terminal 42, current flows through the leakage switch 22. When the leakage switch 22 is in the open position an open circuit condition is created, allowing no leakage current from the voltage source and should therefore be identified as a passing result by the tester 10. When the leakage switch 22 is closed, a short circuit condition is created, thereby allowing a substantial current leakage from the voltage source, and therefore should be identified by the tester 10 as a test failure.

The ground continuity test path comprises the chassis terminal 44, the ground switch 24, and the return terminal 42. When the switch 24 is in the closed position a short circuit condition is created, thereby supplying a minimal amount of resistance, well under the safety requirement, to the current flowing between the chassis terminal 44 and the return terminal 42 and therefore should be identified as a passing result by the tester 10. When the switch 24 is open, an open circuit condition is created between the chassis terminal 44 and the return terminal 42, which should therefore be identified as a test failure by the tester 10.

All three passing conditions can be verified at the same time be setting the switches 20, 22, 24 to the 'PASS' position. The more important safety function of the simulator 14 is to simulate a failure condition under any of the tests, and to verify that the tester 10 identifies the failing condition. Therefore, while all three failure tests can be performed simultaneously by moving the switches 20, 22, 24 to the 'FAIL' position, to ensure proper operation of the tester 10 only one failure test should be performed at any given time.

The following is an example test plan for operation of the simulator 14 in testing a hipot tester 10.

1) Connect the hipot tester 10 to the simulator 14.
   a) Connect the high voltage output of the hipot tester 10 to the high voltage terminal 40 of the simulator 14.
   b) Connect the return lead of the high voltage output on the hipot tester 10 to the return terminal 42 of the simulator 14.
   c) Connect the ground lead of the hipot tester 10 to the chassis terminal 44 of the simulator 14.
2) Conduct a simulated PASSING test by setting all three switches 16A–C on the simulator 14 to the 'PASS' setting and initiating a hipot test by starting the hipot tester 10.
   a) The hipot tester 10 should indicate a 'PASS' condition for all tests.
3) Conduct a simulated ground open test by setting the ground switch 16B on the simulator 14 to the 'FAIL' position. Begin testing by starting the hipot tester 10.
   a) The hipot tester 10 should indicate 'FAIL,' stop testing.
4) Conduct a simulated excess leakage test by setting the leakage switch 16C on the simulator 14 to the 'FAIL' position. (All other switches on the simulator 14 should be set to the 'PASS' position.) Begin testing by starting the hipot tester 10.
   a) The hipot tester 10 should indicate 'FAIL,' stop testing.
5) Conduct a simulated hipot failure test by setting the hipot voltage test switch 16A on the simulator 14 to the 'FAIL' position. (All other switches on the simulator 14 should be set to the 'PASS' position.) Begin testing by starting the hipot tester 10.
   a) The dielectric breakdown should be visible as an arc in the arc view window of the simulator 14.
   b) The hipot tester 10 should indicate 'FAIL,' stop testing.

Other embodiments of the simulator 14 may include impedance elements to calibrate the tester 10 or provide a more sensitive testing environment for the tester 10.

Figure 5:
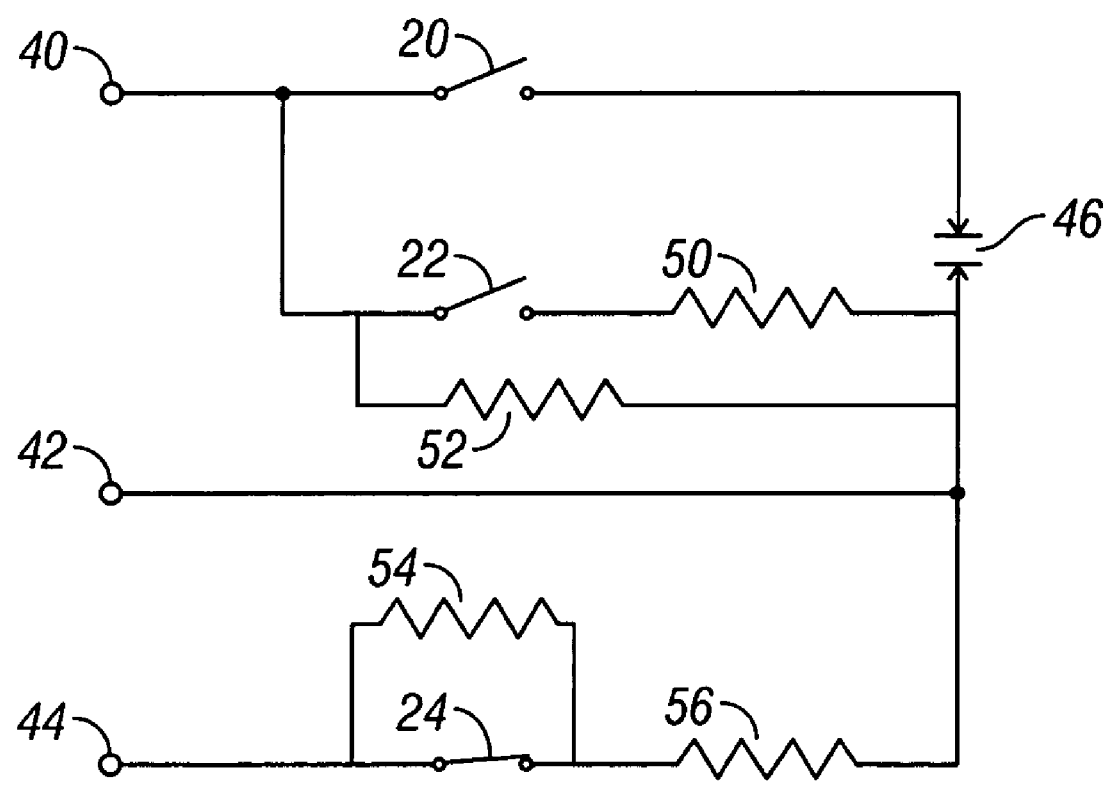
FIG. 5 is a modified schematic diagram of the simulator schematic diagram of FIG. 4.

FIG. 5 is a modified schematic diagram of the simulator schematic of FIG. 4. The excess leakage test path can be modified to include an impedance element, such as a resistor 50 or capacitor, in series with the leakage switch 22, and an impedance element, such as a resistor 52 or capacitor, in parallel with the leakage switch 22 and the resistor 50. Values for the resistors 50, 52 can be chosen such that, for example, if the supply voltage to the high voltage terminal 56 is 1000 V and the leakage current maximum is 1.5 mA, the resistors 50, 52 could have values of 1 MΩ each. In this embodiment, when the leakage switch is open and 1000 V is applied to the high voltage terminal, only 1 mA will flow through the resistor 52 and the tester 10 should show a passing result. However, when the leakage switch 22 is closed, 2 mA will flow through the two 1 MΩ resistors 50, 52 in parallel, and the tester 10 should show a failing result.

The ground continuity test path can be modified also to include two optional resistors. A first resistor 54 can be implemented in parallel with the ground switch 24, and a second resistor 56 can be implemented in series with the parallel resistor 54 and switch 24. Values for the resistors 54, 56 can be chosen such that, if the maximum ground resistance allowable is 0.1Ω, resistor 54 can be chosen to have a value of 0.04Ω and resistor 56 can be chosen to have a value of 0.07Ω. In this embodiment, when the test current is applied, a resistance of 0.07Ω will be seen by the tester 10 and the tester 10 should indicate a passing result. However, when the ground switch 24 is open a total resistance of 0.11Ω will be seen by the tester and the tester 10 should indicate a failing result. It will be appreciated that the resistance of the switch 24 and wiring in the tester should be considered when selecting these resistor values.

A plurality of combinations of values can be chosen for the impedance elements 50, 52, and resistors 54, 56 to correspond to passing and failing conditions according to the leakage current, ground resistance, and calibration requirements of the tester 10.

The foregoing description details certain embodiments of the invention. It will be appreciated, however, that no matter how detailed the foregoing appears in text, the invention can be practiced in many ways. As is also stated above, it should be noted that the use of particular terminology when describing certain features or aspects of the invention should not be taken to imply that the terminology is being re-defined herein to be restricted to including any specific characteristics of the features or aspects of the invention with which that terminology is associated. The scope of the invention should therefore be construed in accordance with the appended claims and any equivalents thereof.

What is claimed is:

1. A simulator for verifying the functionality of an electrical product safety tester, said simulator comprising:
   a plurality of electrical input/output terminals for connection to a plurality of test terminals on said electrical product safety tester;
   a first test path comprising a high voltage input from a first of said plurality of electrical input/output terminals, a first switch, an air gap device designed to arc over at a specific high level voltage, and a second terminal of said plurality of electrical input/output terminals; and
   an arc view window.

2. The simulator of claim 1, further comprising an additional test path comprising said high voltage input, a second switch, and said second terminal.

3. The simulator of claim 1, further comprising an additional test path comprising an input terminal from a third of said plurality of terminals, a third switch, and said second terminal.

4. The simulator of claim 1, wherein said air gap device is designed to arc over at about 750V.

5. The simulator of claim 1, wherein said air gap device is an engine spark plug.

6. The simulator of claim 1, wherein said simulator is portable.

7. The simulator of claim 2, further comprising in said additional test path a first impedance element in series with said second switch, and a second impedance element in parallel with said series connection of said second switch and said first impedance element.

8. The simulator of claim 3, further comprising in said additional test path a first resistor in parallel with said third switch, and a second resistor in series with said parallel connection of said first resistor and said third switch.

9. A method of testing functionality of a production line dielectric withstand tester, comprising:
   connecting said production line dielectric withstand tester to a product simulator, said product simulator being configurable to emulate either a passing product or a failing product; and
   viewing an arc produced inside said product simulator.

10. A product simulator comprising a housing, an arc view window, and at least one switch, wherein an operator can view the break down of an air gap device through said arc view window, and wherein said switch is configured to alter a test path in said product simulator so as to alternatively simulate a product that passes a production line dielectric test and a product that fails a production line dielectric test.

11. The simulator of claim 10, further comprising a second switch, wherein said second switch is configured to alter a second test path in said product simulator so as to alternatively simulate a product that passes a production line ground continuity test and a product that fails a production line ground continuity test.

12. The simulator of claim 10, further comprising a second switch, wherein said second switch is configured to alter a second test path in said product simulator so as to alternatively simulate a product that passes a production line leakage current test and a product that fails a production line leakage current test.

13. A simulator for verifying the functionality of an electrical product safety tester, said simulator comprising:
   a plurality of electrical input/output terminals for connection to a plurality of test terminals on said electrical product safety tester;
   a first test path comprising a high voltage input from a first of said plurality of terminals, a first switch, an air gap device designed to arc over at a specific high level voltage, and a second terminal of said plurality of terminals;
   wherein said air gap device is designed to arc over at about 750V.

14. A simulator for verifying the functionality of an electrical product safety tester, said simulator comprising:
   a plurality of electrical input/output terminals for connection to a plurality of test terminals on said electrical product safety tester;
   a first test path comprising a high voltage input from a first of said plurality of terminals, a first switch, an air gap device designed to arc over at a specific high level voltage, and a second terminal of said plurality of terminals;
   an additional test path comprising said high voltage input, a second switch, said second terminal, a first impedance element in series with said second switch, and a second impedance element in parallel with said series connection of said second switch and said first impedance element.

15. A simulator for verifying the functionality of an electrical product safety tester, said simulator comprising:
   a plurality of electrical input/output terminals for connection to a plurality of test terminals on said electrical product safety tester;
   a first test path comprising a high voltage input from a first of said plurality of terminals, a first switch, an air gap device designed to arc over at a specific high level voltage, and a second terminal of said plurality of terminals;
   an additional test path comprising an input terminal from a third of said plurality of terminals, a third switch, said second terminal, a first resistor in parallel with said third switch, and a second resistor in series with said parallel connection of said first resistor and said third switch.

* * * * *